(12) United States Patent
Bae et al.

(10) Patent No.: US 7,927,517 B2
(45) Date of Patent: Apr. 19, 2011

(54) COATING SOLUTION FOR FORMING HIGH DIELECTRIC CONSTANT THIN FILM AND METHOD FOR FORMING DIELECTRIC THIN FILM USING THE SAME

(75) Inventors: Jun Hee Bae, Kyungki-do (KR); Seung Hyun Kim, Kyungki-do (KR); Yul Kyo Chung, Kyungki-do (KR); Won Hoon Song, Seoul (KR); Sung Taek Lim, Incheon (KR); Hyun Ju Jin, Seoul (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 12/437,657

(22) Filed: May 8, 2009

(65) Prior Publication Data

US 2009/0219671 A1 Sep. 3, 2009

Related U.S. Application Data

(62) Division of application No. 11/541,673, filed on Oct. 3, 2006, now Pat. No. 7,540,913.

(30) Foreign Application Priority Data

Oct. 4, 2005 (KR) .................. 10-2005-0093143

(51) Int. Cl.
*C09D 5/24* (2006.01)
*H01B 1/08* (2006.01)

(52) U.S. Cl. ............... 252/520.2; 252/519.2; 252/519.3; 106/287.19; 361/301.3; 361/311

(58) Field of Classification Search ............ 106/287.19; 252/519.3, 520.2; 361/301.3, 311
See application file for complete search history.

(56) References Cited

U.S. PATENT DOCUMENTS

| 5,593,495 A | 1/1997 | Masuda et al. | |
|---|---|---|---|
| 5,776,788 A | 7/1998 | Aoki et al. | |
| 7,540,913 B2 * | 6/2009 | Bae et al. ............... | 106/287.19 |
| 2006/0225614 A1 * | 10/2006 | Hagiwara et al. ........ | 106/287.19 |
| 2008/0090006 A1 | 4/2008 | Yoshinaka et al. | |

FOREIGN PATENT DOCUMENTS

| JP | 7-37422 | 2/1995 |
|---|---|---|
| JP | 2003-255522 | 9/2003 |

OTHER PUBLICATIONS

Japanese Office Action, with English translation, issued in Japanese Patent Application No. 2006-272931, mailed Mar. 2, 2010.
United States Office Action issued in U.S. Appl. No. 12/437,672 dated Mar. 31, 2010.
United States Office Action issued in U.S. Appl. No. 12/437,657 dated Mar. 31, 2010.
U.S. Notice of Allowance issued in U.S. Appl. No. 12/437,672, mailed on Oct. 15, 2010.
United States Office Action issued in U.S. Appl. No. 12/437,672, dated Jul. 8, 2010.

* cited by examiner

*Primary Examiner* — David M Brunsman
(74) *Attorney, Agent, or Firm* — McDermott Will & Emery LLP

(57) ABSTRACT

Disclosed herein are a coating solution for the formation of a dielectric thin film and a method for the formation of a dielectric thin film using the coating solution. The coating solution comprises a titanium alkoxide, a β-diketone or its derivative, and a benzoic acid derivative having an electron donating group. The method comprises spin coating the coating solution on a substrate to form a thin film and drying the thin film at a low temperature to crystallize the thin film. The titanium-containing coating solution is highly stable. In addition, the coating solution enables formation of a thin film, regardless of the kind of substrates, and can be used to form dielectric thin films in an in-line mode in the production processes of PCBs.

4 Claims, 3 Drawing Sheets

(a)

(b)

COATING SOLUTION FOR FORMING HIGH DIELECTRIC CONSTANT THIN FILM AND METHOD FOR FORMING DIELECTRIC THIN FILM USING THE SAME

RELATED APPLICATIONS

This application is a divisional of 11/541,673, filed Oct. 3, 2006, now U.S. Pat. No. 7,540,913, which application is based on, and claims priority from, Korean Application Number 2005-93143, filed on Oct. 4, 2005, the disclosure of which is incorporated by reference herein in its entirety.

BACKGROUND OF THE INVENTION

1. Field of the Invention

The present invention relates to a coating solution for the formation of a high dielectric constant thin film and a method for the formation of a dielectric thin film using the coating solution. More specifically, the present invention relates to a coating solution for forming a high dielectric constant thin film which comprises a stabilized precursor, and a method for forming a high dielectric constant thin film by applying the coating solution to a substrate and drying the coated substrate at a low temperature.

2. Description of the Related Art

Semiconductor devices are becoming smaller in size and weight and more convergent. There is a strong tendency to embed semiconductor devices and the number of input/output terminals in semiconductor devices is increasing. Under these circumstances, a number of passive elements (including capacitors) capable of performing many functions in a defined capacity must be accommodated in the vicinity of active integrated circuit chips. Decoupling capacitors are used to stably supply an electric power to input terminals. In decoupling capacitors, an electric power region must be kept close to a ground region such that plane inductance and via inductance are reduced to extend low-impedance regions in a high frequency range.

To this end, embedding of decoupling capacitors under active integrated circuit chips is recognized as an optimal solution. In embedded capacitors using dielectric thin films, the dielectric thin films are formed within printed circuit boards positioned below active integrated circuit chips. As a result, an electric power region is as close as possible to a ground region so that the length of lines connected to the capacitors can be minimized to effectively reduce low-impedance regions in a high frequency range.

Continuous efforts have been made to minimize the area of embedded capacitors using high dielectric constant materials. Composite metal-oxide dielectrics, such as $SrTiO_3$, BST and PLZT are currently known as the most useful materials for practical applications. For the practical applications of dielectric thin films using the materials, low-temperature formation of the dielectric thin films is required to improve the temperature characteristics of the dielectric thin films and make the dielectric thin films suitable for the fabrication of various kinds of semiconductor devices.

Dielectric thin films are formed by physical processes, e.g., vacuum evaporation, sputtering and laser abrasion, sol-gel processes based on the thermal decomposition of organometallic compounds, and chemical processes, e.g., chemical vapor deposition. Of these, sol-gel processes are most generally used from the standpoint of processing costs.

Japanese Unexamined Patent Publication No. Hei 7-37422 discloses a coating solution for forming a ferroelectric film and a method for forming a ferroelectric film using the coating solution by a sol-gel process wherein the coating solution comprises an organometallic compound represented by $ATiO_3$ (where A=Ba, Sr, Ca, Mg or Pb) or $Bi_4Ti_3O_{12}$ as a raw material, a β-diketone as a stabilizer, and hydrogen peroxide as an oxidant.

U.S. Pat. No. 5,776,788 discloses a method for forming a PZT dielectric film by a sol-gel process and a method for manufacturing a capacitor. According to this patent, a dielectric thin film is formed by preparing a coating solution containing an organometallic compound and an alkanolamine, drying the coating solution to form a thin film, and oxidatively sintering the thin film to obtain a perovskite crystal.

U.S. Pat. No. 5,593,495 discloses a method for manufacturing a thin film of composite metal-oxide dielectric by a sol-gel process. According to this method, a thin film is manufactured by spin coating a precursor solution on a substrate to form a thin film in a sol state, drying the thin film in the sol state to form a thin film of dry gel, and subjecting an obtained dry gel thin film to a heat treatment at 500 to 600° C. and crystallizing the obtained dry gel thin film.

According to the conventional methods, dielectric thin films are generally formed by a sol-gel process. Specifically, dielectric thin films are generally formed by spin coating a coating solution to a thin film, thermally decomposing the thin film at 300-400° C., and annealing the thin film at 600° C. or higher to crystallize the thin film.

SUMMARY OF THE INVENTION

It is one object of the present invention to provide a coating solution for the formation of a dielectric thin film that can be crystallized at a low temperature, regardless of the kind of substrates, without the need for high-temperature annealing, which is essentially involved in conventional methods.

It is another object of the present invention to provide a method for forming a thin film using the coating solution.

In accordance with one aspect of the present invention, there is provided a coating solution for the formation of a high dielectric constant thin film which comprises a titanium alkoxide, a β-diketone or its derivative, a benzoic acid derivative having an electron donating group, water, and a solvent.

In accordance with another aspect of the present invention, there is provided a method for forming a dielectric thin film, the method comprising the steps of spin coating the coating solution on a substrate to form a thin film, and drying the coated substrate at a low temperature to crystallize the thin film.

In accordance with yet another aspect of the present invention, there is provided an embedded capacitor comprising a dielectric thin film formed by the method.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
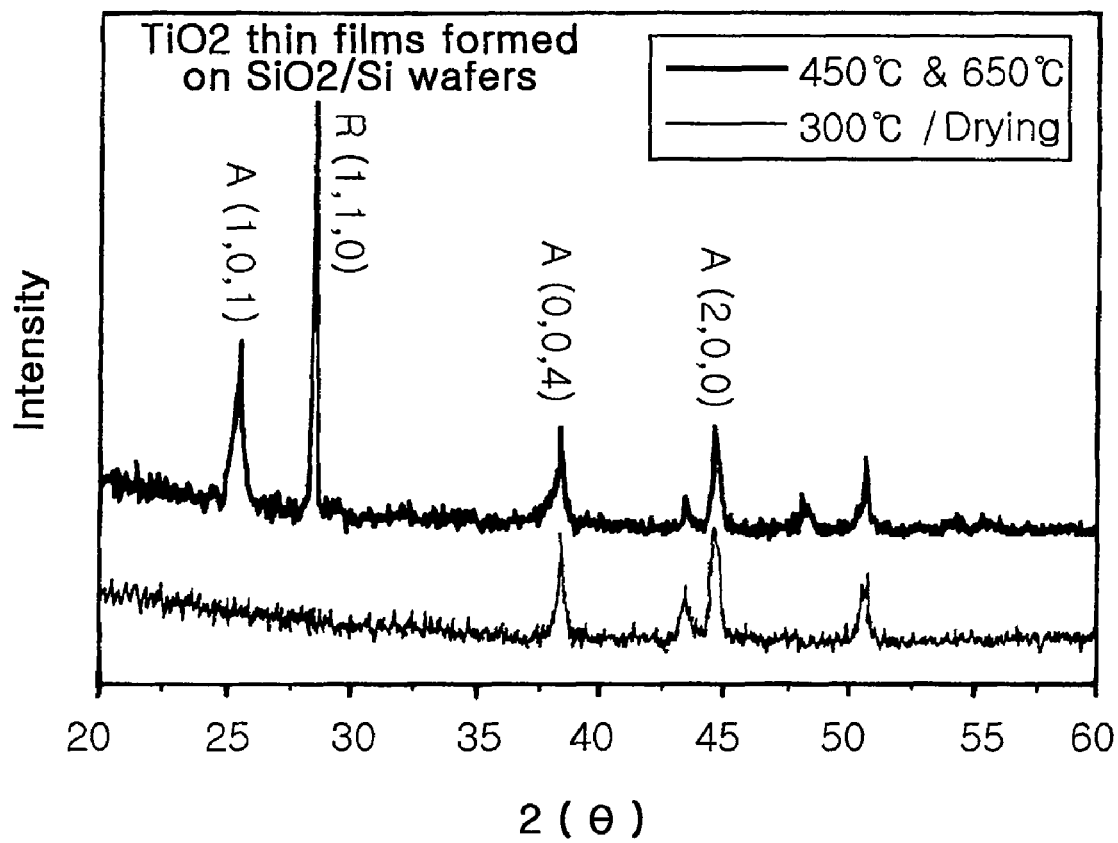
FIG. 1 shows X-ray diffraction patterns of dielectric thin films formed by a low-temperature method of the present invention and a conventional high-temperature method.

The present invention will now be described in greater detail.

The present invention provides a coating solution for the formation of a dielectric thin film which comprises a titanium alkoxide, a β-diketone or its derivative as a complexation stabilizer of the titanium compound, a benzoic acid derivative having an electron donating group, water, and a solvent. The titanium-containing coating solution of the present invention is highly stable. In addition, the coating solution of the present invention is subjected to low-temperature drying at about 100° C. to about 300° C. without the need for high-temperature calcination, which is essentially required for the crystallization of dielectric thin films in conventional methods, to achieve improved low-temperature crystallization characteristics.

As the titanium alkoxide, there can be used, for example, tetraisopropyl titanate, tetra-n-butyl titanate or tetrakis(2-ethylhexyl)titanate. Tetraisopropyl titanate is particularly preferred. The titanium alkoxide is preferably used in an amount of 10 to 15 vol %, based on the total volume of the coating solution. When the titanium alkoxide is used in an amount of less than 10 vol %, the desired dielectric constant of a final capacitor cannot be attained. Meanwhile, when the titanium alkoxide is used in an amount exceeding 15 vol %, the titanium compound may remain, resulting in deteriorated electrical properties, e.g., current leakage, of a final capacitor.

The β-diketone or derivative thereof is preferably used to stabilize the complexation of the titanium alkoxide. Examples of such β-diketones and derivatives thereof include, but are not limited to, pentan-2,4-dione, 5-amino-4-hydroxy-pentanone, and 2-methoxy ethyl acetate. These β-diketones and derivatives thereof are coordinated to the titanium alkoxide to form a highly stabilized precursor. The complexation stabilizer is preferably used in an amount of 3 to 5 vol %, based on the total volume of the coating solution. If the complexation stabilizer is used in an amount of less than 3 vol %, i.e. it is at a level insufficient to form the coating solution, steric hindrance effects and induction effects resulting from the coordination of the complexation stabilizer to the titanium alkoxide cannot be sufficiently induced, making it difficult to prepare a stable precursor solution.

The benzoic acid derivative having an electron donating group acts as an acid catalyst in the coating solution of the present invention. The benzoic acid derivative is preferably modified with an electron donating group, such as an amino, alkyl or alkoxy group. Aminobenzoic acids are particularly preferred. Acetic acid is generally used as an acid catalyst in conventional methods. Acetic acid has a relatively high tendency to dissociate into protons ($H^+$), resulting in a high reactivity with water. The benzoic acid derivative acting as an acid catalyst is preferably used in an amount of 1 to 2 vol %, based on the total volume of the coating solution. The use of the benzoic acid derivative in an amount of less than 1 vol % causes reduced reactivity with water. Meanwhile, the use of the benzoic acid derivative in an amount of more than 2 vol % causes increased reactivity with water, thus making it difficult to maintain an optimal reactivity with water.

Water is added together with the acid catalyst. The water is preferably distilled water. The amount of the water added is preferably between 3 and 5 vol %, based on the total volume of the coating solution. An alcohol is preferably used as the solvent of the coating solution according to the present invention. Isopropanol is particularly preferably used as the solvent.

The coating solution for the formation of a dielectric thin film according to the present invention is prepared in accordance with the following procedure. First, a titanium alkoxide is mixed with a β-diketone or its derivative in a solvent, e.g., isopropanol. The mixture is stirred at 200-300 rpm at room temperature for 1-2 hours to form a stable precursor. An acid catalyst and water are added to the mixture, followed by stirring at 200-300 rpm for 24-48 hours to prepare the final coating solution.

In the coating solution, the β-diketone or derivative thereof as a complexation stabilizer is coordinated to the titanium alkoxide to form a highly stabilized precursor. The addition of a benzoic acid derivative having an electron donating group as the acid catalyst to the precursor leads to a further increase in the stability of the coating solution in water. The stability of the coating solution can be explained by induction effects, steric hindrance effects and lowered ionization tendency of the acid catalyst.

First, the β-diketone compound acting as a complexation stabilizer is coordinated to the titanium alkoxide to form a precursor. The structure of the precursor is depicted below.

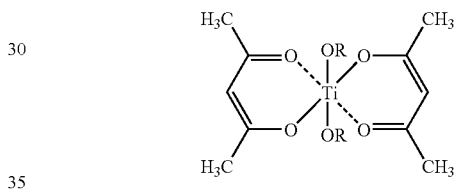

As depicted above, since the β-diketone compound coordinated to the titanium atom includes alternating double bonds and single bonds to form a resonance structure in which electrons are uniformly distributed, the precursor is highly stabilized. In addition, the bulky groups, i.e. alkoxy groups, positioned in the vicinity of the titanium atom protect the titanium atom from the attack of water molecules, resulting in a further increase in the stability of the precursor.

The benzoic acid derivative having an electron donating group, acting as an acid catalyst, added to the precursor, has a higher pKa than acetic acid, which is generally used as an acid catalyst in conventional methods. Accordingly, the benzoic acid derivative relatively prevents the dissociation of $H^+$ to lower the reactivity of the precursor with water.

In another aspect, the present invention provides a method for forming a dielectric thin film, the method comprising the steps of spin coating the coating solution on a substrate to form a thin film, and drying the coated substrate at a low temperature to crystallize the thin film.

Specifically, a high dielectric constant thin film is formed by the following procedure. First, the coating solution, which comprises a titanium alkoxide, a β-diketone or its derivative, a benzoic acid derivative having an electron donating group, water, and a solvent, is applied to a substrate by spin coating at 3,000-5,000 rpm for 10-20 seconds to form a thin film. Thereafter, the thin film is dried at a low temperature of 100-300° C. to form the final dielectric thin film.

The method of the present invention is achieved by a sol-gel process. According to conventional methods, a dielectric thin film is generally formed by thermally decomposing a thin film in a range of 300-400° C. and annealing the thin film at 600° C. or higher to crystallize the thin film. In contrast, according to the method of the present invention, a dielectric thin film can be crystallized at a low temperature, regardless of the kind of substrates, such as wafers, metal foils and epoxy boards, without the need for high-temperature annealing, which is essentially involved in the conventional methods. In addition, according to the method of the present invention, dielectric thin films can be formed in an in-line mode in the production processes of PCBs.

More specifically, a high dielectric constant thin film is formed by the following procedure. First, the coating solution is applied to a thickness of 100-300 nm on a substrate, and spin-coated at 3,000-5,000 rpm for 10-20 seconds to form a thin film. Thereafter, the coated substrate is dried on an oven or a hot plate at a low temperature of 100-300° C. for 30 minutes to crystallize the final dielectric thin film. At this time, the coating solution is preferably applied to a thickness of 300 nm, and the spin coating is preferably performed at 4,000 rpm for 17 seconds.

As described above, since the β-diketone or derivative thereof is coordinated to the titanium alkoxide to form a stable precursor structure, the coating solution of the present invention is highly stable, for example, in water. In addition, the coating solution of the present invention has improved low-temperature crystallization characteristics, thus resulting in a considerable reduction of phase formation temperature to 100-300° C. Furthermore, the coating solution of the present invention enables formation of a thin film, regardless of the kind of substrates, such as wafers, metal foils and epoxy boards, and can be used to form dielectric thin films in an in-line mode in the production processes of PCBs. Moreover, the coating solution of the present invention can be applied to embedded capacitors.

Hereinafter, the present invention will be explained in more detail with reference to the following examples. However, these examples are not intended to limit the present invention.

EXAMPLES

Preparative Example 1

11.7 ml of tetraisopropyl titanate and 4.5 ml of pentan-2,4-dione were added to 79.8 ml of isopropanol. The mixture was stirred at 200 rpm at room temperature for one hour to form a stable precursor, and then 1.5 ml of a benzoic acid derivative having an electron donating group and 2.5 ml of distilled water were added thereto. The resulting mixture was stirred at 300 rpm for 48 hours to form a $TiO_2$ sol solution.

Preparative Example 2

11.7 ml of tetraisopropyl titanate and 4.2 ml of 5-amino-4-hydroxy-pentanone were added to 79.8 ml of isopropanol. The mixture was stirred at 200 rpm at room temperature for one hour to form a stable precursor, and then 1.5 ml of a benzoic acid derivative having an electron donating group and 1.5 ml of distilled water were added thereto. The resulting mixture was stirred at 300 rpm for 24 hours to form a $TiO_2$ sol solution.

Preparative Example 3

11.7 ml of tetraisopropyl titanate and 4.2 ml of 2-methoxy ethyl acetate were added to 79.8 ml of isopropanol. The mixture was stirred at 200 rpm at room temperature for one hour to form a stable precursor, and then 1.5 ml of a benzoic acid derivative having an electron donating group, which had a higher pKa than acetic acid, and 2.5 ml of distilled water were added thereto. The resulting mixture was stirred at 300 rpm for 48 hours to form a $TiO_2$ sol solution.

Preparative Example 4

11.7 ml of tetra-n-butyl titanate and 4.2 ml of pentan-2,4-dione were added to 79.8 ml of isopropanol. The mixture was stirred at 200 rpm at room temperature for one hour to form a stable precursor, and then 1.5 ml of a benzoic acid derivative having an electron donating group, which had a higher pKa than acetic acid, and 2.5 ml of distilled water were added thereto. The resulting mixture was stirred at 300 rpm for 48 hours to form a $TiO_2$ sol solution.

Preparative Example 5

11.7 ml of tetra-n-butyl titanate and 4.2 ml of 5-amino-4-hydroxy-pentanone were added to 79.8 ml of isopropanol. The mixture was stirred at 200 rpm at room temperature for one hour to form a stable precursor, and then 1.5 ml of a benzoic acid derivative having an electron donating group, which had a higher pKa than acetic acid, and 2.5 ml of distilled water were added thereto. The resulting mixture was stirred at 300 rpm for 48 hours to form a $TiO_2$ sol solution.

Preparative Example 6

11.7 ml of tetra-n-butyl titanate and 4.2 ml of 2-methoxy ethyl acetate were added to 79.8 ml of isopropanol. The mixture was stirred at 200 rpm at room temperature for one hour to form a stable precursor, and then 1.5 ml of a benzoic acid derivative having an electron donating group, which had a higher pKa than acetic acid, and 2.5 ml of distilled water were added thereto. The resulting mixture was stirred at 300 rpm for 48 hours to form a $TiO_2$ sol solution.

Preparative Example 7

11.7 ml of tetrakis(2-ethylhexyl)titanate and 4.2 ml of pentan-2,4-dione as a complexation stabilizer were added to 79.8 ml of isopropanol. The mixture was stirred at 200 rpm at room temperature for one hour to form a stable precursor, and then 1.5 ml of a benzoic acid derivative having an electron donating group, which had a higher pKa than acetic acid, and 2.5 ml of distilled water were added thereto. The resulting mixture was stirred at 300 rpm for 48 hours to form a $TiO_2$ sol solution.

Preparative Example 8

11.7 ml of tetrakis(2-ethylhexyl)titanate and 4.2 ml of 5-amino-4-hydroxy-pentanone were added to 79.8 ml of isopropanol. The mixture was stirred at 200 rpm at room temperature for one hour to form a stable precursor, and then 1.5 ml of a benzoic acid derivative having an electron donating group, which had a higher pKa than acetic acid, and 2.5 ml of distilled water were added thereto. The resulting mixture was stirred at 300 rpm for 48 hours to form a $TiO_2$ sol solution.

Preparative Example 9

11.7 ml of tetrakis(2-ethylhexyl)titanate and 4.2 ml of 2-methoxy ethyl acetate were added to 79.8 ml of isopropanol. The mixture was stirred at 200 rpm at room temperature for one hour to form a stable precursor, and then 1.5 ml of a benzoic acid derivative having an electron donating group, which had a higher pKa than acetic acid, and 2.5 ml of distilled water were added thereto. The resulting mixture was stirred at 300 rpm for 48 hours to form a TiO$_2$ sol solution.

Example 1

Each of the coating solutions prepared in Preparative Examples 1 to 9 was spin-coated three times on a Pt/Ti/SiO$_2$ wafer at 4,000 rpm for 17 seconds to form a 300 nm thick TiO$_2$ thin film. The TiO$_2$ thin film was dried on a hot plate or an oven at 200° C. for 30 minutes to produce specimens.

Figure 2:
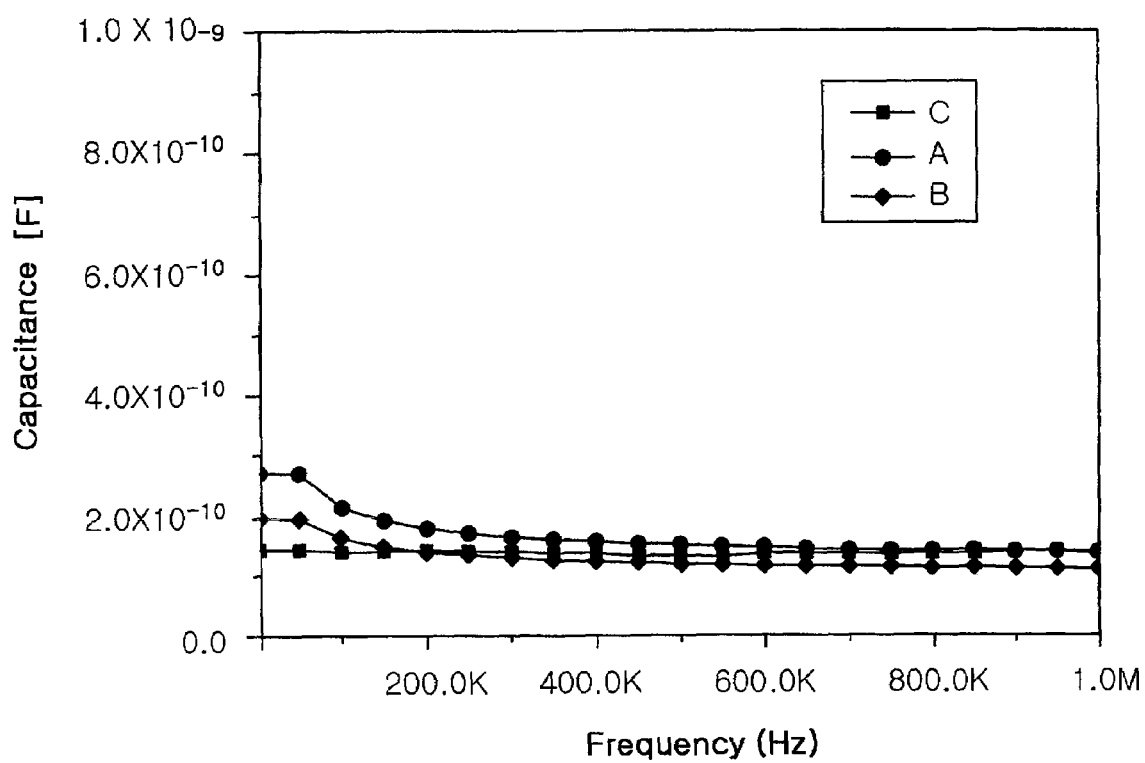
FIG. 2 is a graph showing the variation in the capacitance of dielectric thin films formed by a low-temperature method of the present invention and a conventional high-temperature method as a function of frequency.

After a specified time, the electrical properties of the specimens were measured. Specifically, the dielectric constant of the specimens was measured using an impedance analyzer (Agilent, 4294A) at frequencies from 40 Hz to 1 MHz. The obtained results are shown in FIG. 2. In FIG. 2, points "A" and "B" designate the specimens dried on the hot plate and the oven, respectively.

Comparative Example 1

The procedure of Example 1 was repeated, except that the thin films were thermally decomposed at 450° C. for 10 minutes and at 650° C. for 2 minutes to remove the organic materials, followed by annealing at 650° C. for 30 minutes. The obtained results are shown in FIG. 2 (see, points "C" in FIG. 2).

As shown in FIG. 2, although there were slight differences with varying frequency, the specimens ("C") annealed at a high temperature of 650° C. showed substantially the same dielectric constant profile as the specimens ("A" and "B") dried at a low temperature of 200° C. On the basis of the dielectric constant profiles, it was found that the thin films dried at the low temperature were crystalline.

Example 2

The procedure of Example 1 was repeated, except that the thin films formed on the wafer were dried at 300° C. The results are shown in FIG. 1.

From the X-ray peaks shown in FIG. 1, it could be confirmed that a phase shift occurred from an amorphous state to an anatase phase in the specimens produced in Example 1, as in the specimens produced by thermal decomposition at 450° C. and 650° C. and annealing at 650° C. in Comparative Example 1.

Figure 3:
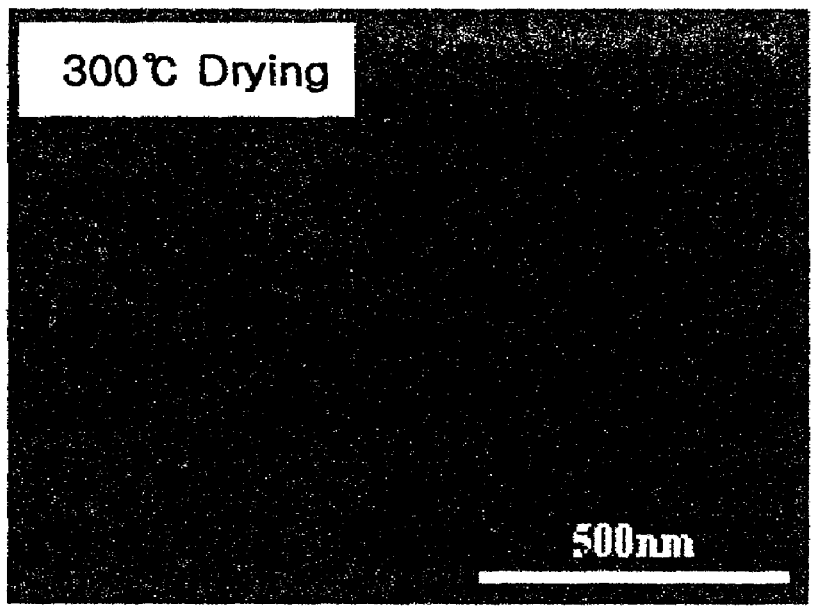
FIGS. 3a and 3b are scanning electron micrographs of a surface and a cross section of a specimen produced by a low-temperature method of the present invention, respectively.
Figure 3:
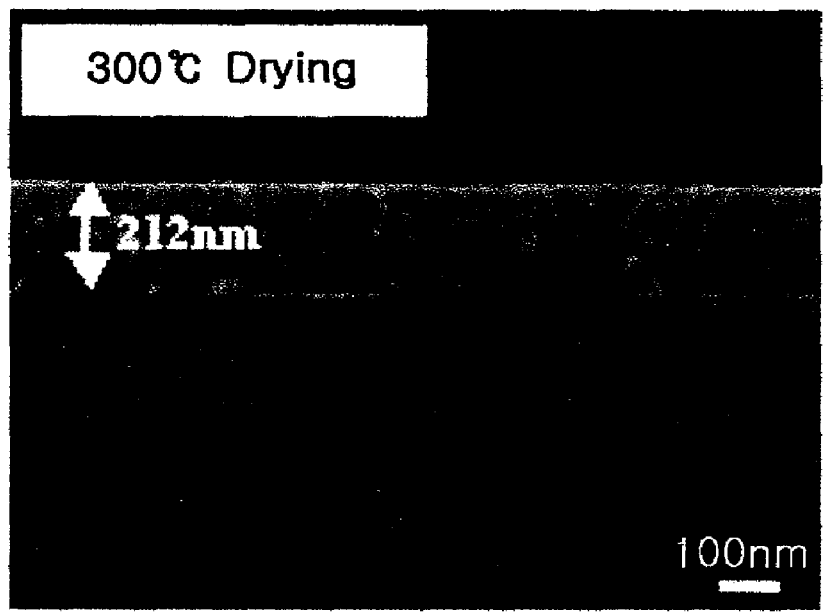

In order to determine whether the specimens were crystallized or not, the surface and cross section of the specimens dried at a low temperature (300° C.) in Example 2 were observed under a scanning electron microscope (SEM) and the images are shown in FIGS. 3a and 3b. The micrographs of FIGS. 3a and 3b demonstrate that the specimens were crystallized to form grain boundaries.

In conclusion, the coating solutions according to the present invention have improved low-temperature crystallization characteristics, thus resulting in a marked reduction of phase formation temperature to 100-300° C.

As apparent from the above description, according to the coating solution of the present invention, a β-diketone is coordinated to a titanium alkoxide to form a stable precursor structure. In addition, the coating solution of the present invention has improved low-temperature crystallization characteristics, thus resulting in a considerable reduction of phase formation temperature to 100-300° C. Furthermore, the coating solution of the present invention enables formation of a thin film, regardless of the kind of substrates, such as wafers, metal foils and epoxy boards, and can be used to form dielectric thin films in an in-line mode in the production processes of PCBs. Moreover, the coating solution of the present invention can be applied to embedded capacitors.

What is claimed is:

1. A dielectric thin film formed by the method comprising the steps of spin coating a coating solution on a substrate to form a thin film which comprises a titanium alkoxide, a β-diketone or its derivative, a benzoic acid modified with an amino, alkyl, or alkoxy group, water and a solvent, wherein the β-diketone or its derivative comprises pentan-2,4 dione, 5-amino-4-hydroxy-pentanone or 2-methoxy ethyl acetate, and the modified benzoic acid is an aminobenzoic acid, alkylbenzoic acid, or alkoxybenzoic acid, and the thin film is dried at 100 to 300° C. to form said dielectric thin film.

2. An embedded capacitor comprising the dielectric thin film according to claim 1.

3. The dielectric thin film according to claim 1, wherein the titanium alkoxide of the coating solution is tetraisopropyl titanate, tetra-n-butyl titanate, or tetrakis(2-ethylhexyl)titanate.

4. The dielectric thin film according to claim 1, wherein the solvent of the coating solution is isopropanol.

* * * * *